(12) United States Patent
Meynants

(10) Patent No.: US 8,283,195 B2
(45) Date of Patent: Oct. 9, 2012

(54) METHOD OF MANUFACTURE OF A BACKSIDE ILLUMINATED IMAGE SENSOR

(75) Inventor: Guy Meynants, Retie (BE)

(73) Assignee: CMOSIS NV, Antwerpen (BE)

( * ) Notice: Subject to any disclaimer, the term of this patent is extended or adjusted under 35 U.S.C. 154(b) by 0 days.

(21) Appl. No.: 12/939,599

(22) Filed: Nov. 4, 2010

(65) Prior Publication Data
US 2011/0101482 A1     May 5, 2011

(30) Foreign Application Priority Data
Nov. 5, 2009  (GB) .................... 0919421.8

(51) Int. Cl.
H01L 21/00  (2006.01)
H01L 31/00  (2006.01)

(52) U.S. Cl. .................... 438/57; 438/90; 257/460

(58) Field of Classification Search ............ None
See application file for complete search history.

(56) References Cited

U.S. PATENT DOCUMENTS

| | | | |
|---|---|---|---|
| 5,262,633 A * | 11/1993 | Kasai et al. | 250/208.1 |
| 5,376,810 A | 12/1994 | Hoenk et al. | |
| 5,532,173 A | 7/1996 | Martin et al. | |
| 5,646,437 A * | 7/1997 | Kasai et al. | 257/437 |
| 7,238,583 B2 | 7/2007 | Swain et al. | |
| 7,521,335 B2 | 4/2009 | Yamanaka | |
| 7,564,079 B2 | 7/2009 | Mabuchi et al. | |
| 2009/0096049 A1 | 4/2009 | Oshiyama et al. | |
| 2009/0121307 A1* | 5/2009 | Tennant | 257/440 |
| 2011/0042773 A1* | 2/2011 | Kurfiss et al. | 257/443 |

FOREIGN PATENT DOCUMENTS

| | | |
|---|---|---|
| EP | 0950264 A1 | 10/1999 |
| EP | 1540733 B1 | 7/2008 |
| EP | 2075843 A2 | 7/2009 |
| WO | 9820561 A1 | 5/1998 |
| WO | 2008139644 A1 | 11/2008 |

OTHER PUBLICATIONS

Holland et al., "Device Design for a 12.3-Megapixel, Fully Depleted, Back-Illuminated, High-Voltage Compatible Charge-Coupled Device", IEEE Transactions on Electron Devices, 2009, vol. 56(11), pp. 2612-2622.

(Continued)

Primary Examiner — Scott B Geyer
(74) Attorney, Agent, or Firm — Bacon & Thomas, PLLC

(57) ABSTRACT

A method of manufacturing a backside illuminated image sensor includes providing a start material that has a layer of semiconductor material on a substrate. The layer of semiconductor material has a first face and a second, backside, face. The layer of semiconductor material is processed to form semiconductor devices in the layer adjacent the first face. At least a part of the substrate is removed to leave an exposed face. A passivation layer is formed on the exposed face, the passivation layer having negative fixed charges. The passivation layer can be Al2O3 (Sapphire). The passivation layer can have a thickness less than 5 μm, advantageously less than 1 μm, and more advantageously in the range 1 nm-150 nm. Another layer, or layers, can be provided on the passivation layer, including: an anti-reflective layer, a layer to improve passivation, a layer including a color filter pattern, a layer comprising a microlens.

18 Claims, 8 Drawing Sheets

OTHER PUBLICATIONS

Shortes, S., et al., "Development of a Thinned, Backside-Illuminated Charge-Coupled Device Imager", proc. IEDM dig., 1973, vol. 19, p. 415.

Prima, J., et al., "A 3 Mega-Pixel Back-Illuminated Image Sensor in 1T5 Architecture with 1.45 μm Pixel Pitch", proc. International Image Sensor Workshop, Jun. 6-10, 2007, pp. 5-8, Ogunquit, ME (avilable on www.imagesensors.org).

Kohyama, Y., et al., "A 1.4 μm Pixel Backside Illuminated CMOS Image Sensor with 300 mm Wafer based on 65 nm Logic Technology", proc. International Image Sensor Workshop, Jun. 2009, Bergen (available on www.imagesensors.org).

Schmidth, J. et al., "Surface Passivation of High-efficiency Silicon Solar Cells by Atomic-layer-deposited Al2O3", Progress in Photovoltaics: Research and Applications, 2008, vol. 15, pp. 461-466, published by J. Wiley.

Fish, A. et al., "Low-power Global/Rolling Shutter Image Sensors in Silicon on Sapphire Technology", ISCAS, May 23-26, 2005, vol. 1, pp. 580-583.

Communication of British Patent Office in regard to British Patent Application No. GB 0919421.8, Mar. 24, 2010.

Communication of British Patent Office in regard to British Patent Application No. GB 0919421.8, Jul. 8, 2010.

Wu, S.G. et al., "A Manufacturable Back-Side Illumination Technology using Bulk-Si Substrate for Advanced CMOS Image Sensor", Jun. 2009, proc. International Image Sensor Workshop, Bergen (available on www.imagesensors.org).

Park, J. et al., "Phototransistor Image Sensor in Silicon on Sapphire", May 18-21, 2008, ISCAS, pp. 1416-1419., New Haven, CT.

* cited by examiner

METHOD OF MANUFACTURE OF A BACKSIDE ILLUMINATED IMAGE SENSOR

TECHNICAL FIELD

This invention relates to a method of manufacturing a backside illuminated image sensor and to an image sensor.

BACKGROUND

Backside illuminated image sensors have been developed since 1973[1], shortly after the invention of the CCD. Until a few years ago, this was limited to charge-coupled devices for high-end applications. Recently, several developments on CMOS image sensors with backside illumination were started, driven by the scaling for small pixels in consumer image sensor applications. In all of these applications, a fully processed wafer of image sensors is thinned through a mechanical and/or chemical thinning process. Before thinning, the wafer is attached to a mechanical handle wafer. Then a mechanical grinding followed by a chemical etching step is used to thin the wafer. Thicknesses of the wafer down to 3 or 5 micron have been used. The sensor is then illuminated from the backside.

A problem that occurs after thinning is the passivation of the backside surface of the image sensor. Without any special measures, a native silicon oxide layer (SiO2) will be formed at the surface of the silicon. The interface between the silicon and the SiO2 layer contains defects in the silicon surface (dangling bonds), which form generation centers of free electrons. Without any specific measures, these free electrons will diffuse into the p-epitaxial layer of the detector and get collected by the photodiode. The generation of these electrons is thermally activated. This will create a significant contribution to the dark current of the image sensor, which is dominant if no countermeasures are taken. Counter measures have to be taken that allow that these charges recombine before they diffuse into the substrate. The silicon oxide layer also contains a fixed density of positive charges. Without passivation implant, an inversion layer will be formed at the surface. Photoelectrically generated charges in the substrate can be trapped at this surface due to this electric field (see FIG. 1). This can cause history effects on the sensor, since the amount of trapped charges may vary over time. This is another reason why a surface passivation is required.

In order to reduce these effects, a native oxide layer is usually avoided and the surface is passivated by an implant (see FIG. 2). In first place, a pre-formed thermally grown SiO2 layer is present. This layer can be present upfront, as is the case in thinning of image sensors processed on silicon-on-isolator substrates [2,3,4] or it can be deposited in a bulk silicon process [5]. To effectively passivate the surface, three approaches are followed.

1) With SOI substrates, a highly doped p+ layer is deposited close to the SOI substrate. This layer is already present in the SOI start material before the CMOS or CCD device processing [2,3,4];

2) with bulk silicon wafers, after the thinning process, the wafers receive a backside p+ implantation followed by a laser anneal to activate the implant [5];

3) with MBE (Molecular Beam Epitaxy), an atomic layer with very high boron concentration is deposited creating a very sharp delta function in the doping. This technique is known as delta doping [6].

Traditionally, delta doping has been the only satisfactory method that can realize a good UV sensitivity due to the very shallow thickness of the passivation implant (which is only a few atomic layers thick). The other methods result in a p+ highly doped layer in the first 10-100 nm of the silicon. Photocharges generated in this layer have a high probability to recombine. This reduces the sensitivity of the image sensor for short wavelengths (in the UV wavelength range between 200 and 400 nm).

References [8], [9] describe image sensors processed on Silicon on Sapphire (SOS) substrates. The carrier wafer is a thick sapphire wafer (typically 725 µm thick) on which a thin (5 µm) layer of silicon is deposited. Sapphire is used because of its transparent properties, allowing the sapphire substrate to remain after processing while still allowing the image sensor to be illuminated from the backside through the sapphire wafer.

SUMMARY

An aspect of the present invention provides a method of manufacturing a backside illuminated image sensor comprising:

providing a start material comprising a layer of semiconductor material on a substrate, the layer of semiconductor material having a first face and a second, backside, face;

processing the layer of semiconductor material to form semiconductor devices in the layer adjacent the first face;

removing at least a part of the substrate to leave an exposed face;

forming a passivation layer on the exposed face, the passivation layer comprising negative fixed charges.

Embodiments of the present invention propose an alternative technique to passivate the back surface of an image sensor, which also achieves a good UV sensitivity.

Advantageously, the passivation layer is a layer of Al2O3 (also known as Sapphire, alumina or Aluminium Oxide). The Al2O3 film contains a stable density of negative fixed charges. Typically, this density is in the region of $9E12/cm^2$. This creates an accumulation layer in the p-type substrate of the image sensor. This accumulation layer can effectively passivate the surface. It ensures that no photoelectric charges are trapped near the back surface and that thermally generated charges recombine. This reduces the dark current in backside illuminated image sensors. Other possible materials for the passivation layer include: Aluminiumfluoride (AlF3); Aluminiumoxynitride (AlON); Zirconiumoxide (ZrO2) under certain conditions; Calciumfluoride (CaF2).

The passivation layer is post-deposited on the backside of a thinned CMOS or CCD image sensor, after the semiconductor layer has been processed. This helps with the problems arising during manufacturing when the substrate of an image sensor is thinned. This allows the passivation layer to be formed using techniques such as low-temperature plasma-assisted vapor deposition.

An advantage of using a relatively thin layer of Al2O3 is that the anti-reflective properties of the backside surface can be adapted. A thick layer of Al2O3, as used in a Silicon on Sapphire process, is not an ideal anti-reflective coating. With a thin layer it is possible to deposit a stack of other materials which can form an anti-reflective coating over the required wavelength range. This stack may, or may not, include additional sapphire layers.

Another advantage of a using a relatively thin layer of Al2O3 is that color filters and/or microlenses can be deposited on the thin layer. On a thicker Al2O3 layer the color filter would be located much too far from the photodiode.

Another advantage of a using a relatively thin layer of Al2O3 is that it will have better UV transmission, with less absorption of UV photons in the Al2O3.

BRIEF DESCRIPTION OF THE DRAWINGS

Embodiments of the invention will be described, by way of example only, with reference to the accompanying drawings in which.

DETAILED DESCRIPTION

Figure 1:
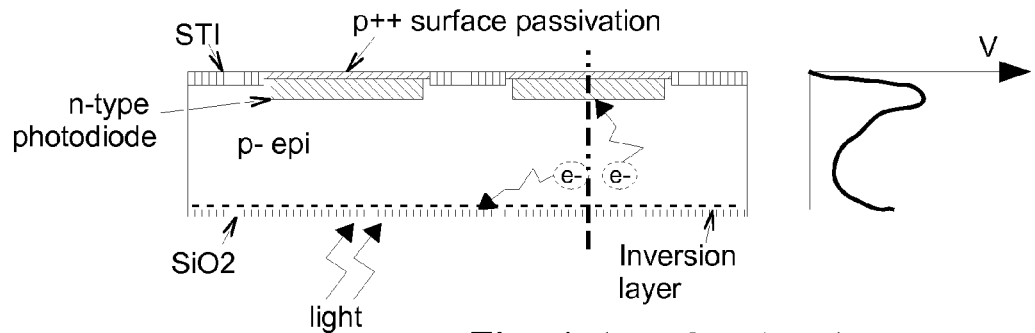
FIG. 1 shows a cross-section of a backside illuminated image sensor (after thinning), without passivation, and the potential profile across the sensor.
Figure 2:
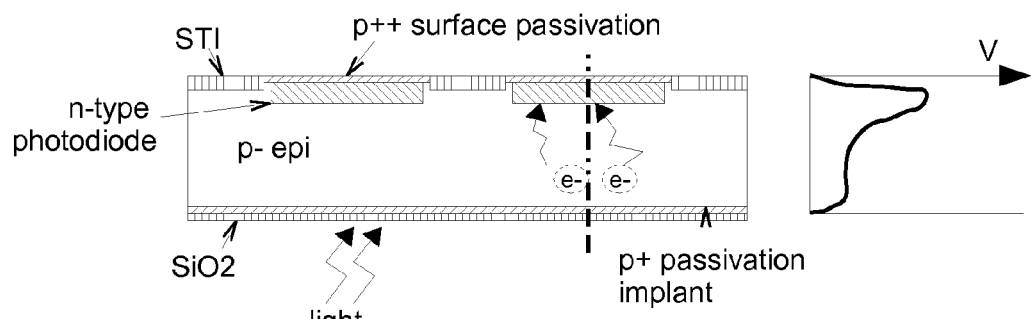
FIG. 2 shows a cross-section of a backside illuminated image sensor (after thinning), employing passivation through a p+ implant layer, and the potential profile across the sensor.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Figure 3:
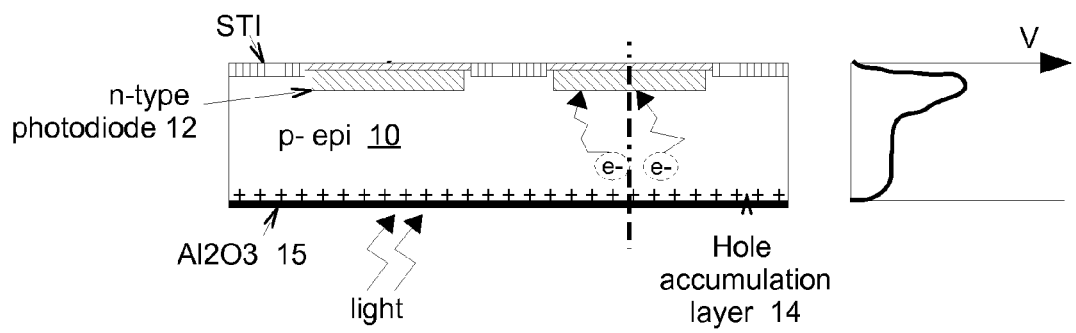
FIG. 3 shows a cross-section of a backside illuminated image sensor (after thinning) resulting from a manufacturing method according to an embodiment of the invention, with an Al2O3 layer providing passivation of the backside surface, and the potential profile across the sensor.

FIG. 3 shows a first embodiment of an image sensor comprising a p-type substrate of material 10 in which semiconductor devices of the image sensor are formed. N-type photodiodes 12 are shown. A layer of Al2O3 (sapphire) 15 is positioned on the backside surface of the p-substrate.

The Al2O3 layer 15 serves as an effective passivation for the backside surface. The Al2O3 film contains a stable density of negative fixed charges, with a surface density around $9E12/cm^2$. This creates an accumulation layer 14 in the p-type substrate of the image sensor. This accumulation layer can effectively passivate the surface. It ensures that no photoelectric charges are trapped near the back surface and that thermally generated charges recombine. This reduces the dark current in backside illuminated image sensors. The mechanism to avoid generation of dark current is that the p-substrate/Al2O3 interface is pinned to ground potential by the accumulation layer (similar as is done by a p+ implant). The accumulation layer 14 in the p-type material is a layer of holes, which are positive charges, similar as a p+ implant. If an electron is thermally generated (=dark current), it recombines with a hole of the accumulation layer. After this, the accumulation layer will attract a new hole from the p-doped substrate to return to the equilibrium situation.

In a backside illuminated image sensor, semiconductor devices (photodiodes, switches) of the image sensor are formed adjacent a first face of the semiconductor layer and the second, backside, face of the layer is exposed to radiation. It will be understood that FIG. 3 shows a cross-section through one small part of the image sensor and that an image sensor will comprise a 1D or 2D array of pixels.

The passivation layer can be post-deposited on the backside of a thinned CMOS or CCD image sensor, after the semiconductor layer has been processed to form semiconductor devices of the image sensor. Other layers can then be deposited on top of the passivation layer.

Figure 4:
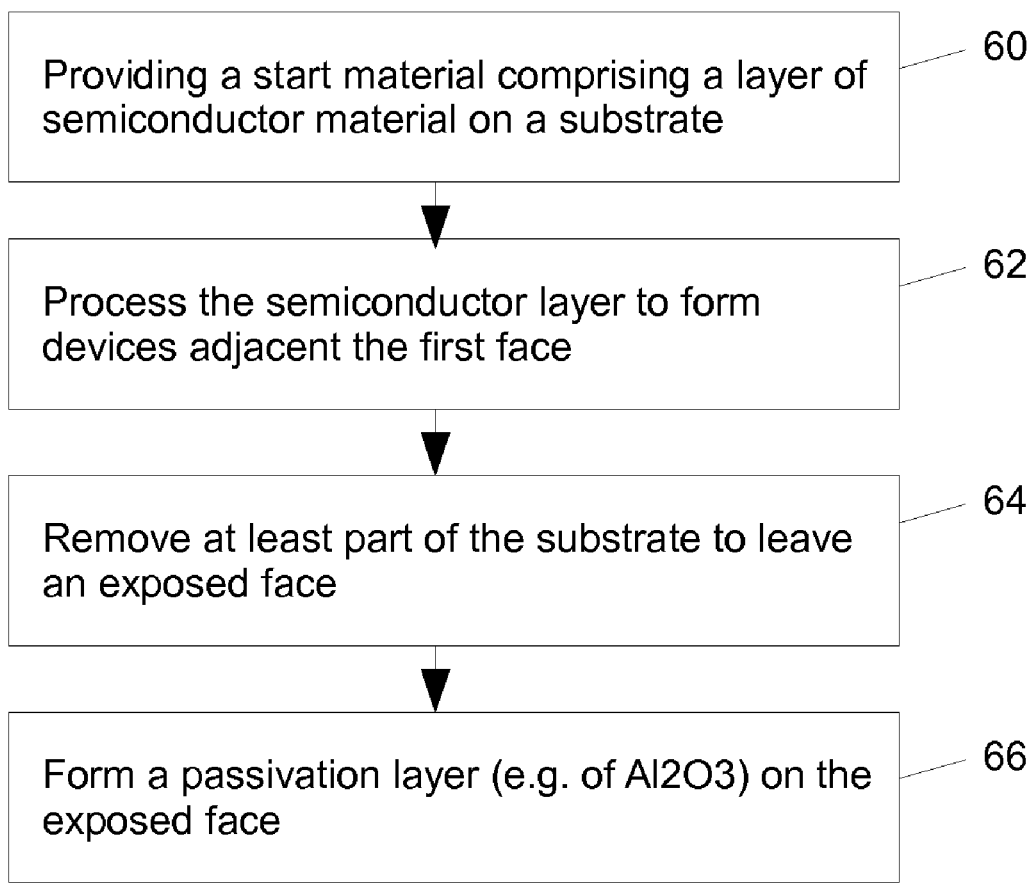
FIG. 4 shows a manufacturing method according to an embodiment of the invention.

FIG. 4 shows steps of a method to manufacture an image sensor of the kind shown in FIG. 3. The method begins at step 60 by providing a start material comprising a layer of semiconductor material (e.g. silicon) on a substrate, the layer of semiconductor material having a first face and a second, backside, face. The start material can comprise a semiconductor material with a semiconductor epitaxial layer which has been formed on top of it, or the start material can be a non-semiconductor material (e.g. an insulator) with a semiconductor epitaxial layer insulator which has been formed on top of it. At step 62 the layer of semiconductor material is processed (e.g. by a CMOS process) to form semiconductor devices (e.g. photodiodes, switches) of the image sensor in the layer, adjacent the first face. At step 64 the method removes at least a part of the substrate to leave an exposed face. If the substrate is a semiconductor material, then at least part of the substrate is removed to leave the device layer with the active circuitry. When the substrate is at least partially a different material, such as SOI, the substrate will be totally removed. In both cases, the removal of at least part of the substrate leaves an exposed face on which the passivation can be deposited. At step 66 the method forms a passivation layer on the exposed face, the passivation layer comprising negative charges.

Figure 5:
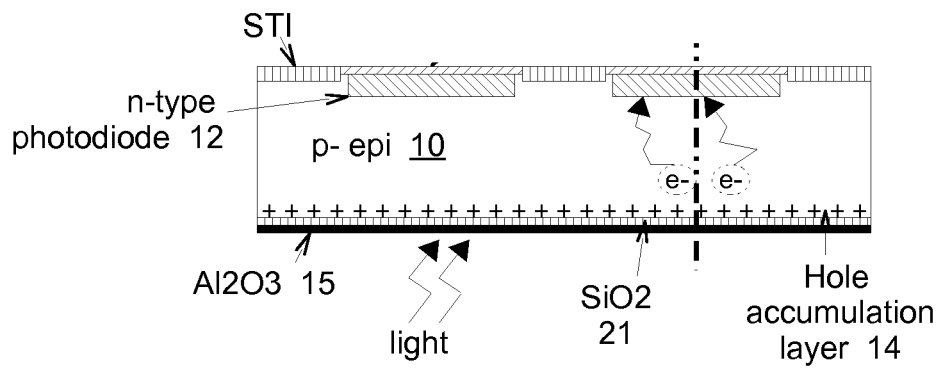
FIG. 5 shows a cross-section of a backside illuminated image sensor similar to that shown in FIG. 3, with an SiO2 layer.

The passivation layer with negative fixed charges, such as the Al2O3 layer, can be formed or deposited directly on top of the silicon layer. Alternatively a small SiO2 oxide layer 21 can be present between the passivation layer and the silicon, as shown in FIG. 5. This SiO2 layer 21 can have been deposited intentionally, or it may have been formed natively during the processing of the substrate. For example, during or after the thinning process a native thin (<10 nm) thermal oxide can be formed on top of the silicon. Such native oxide is of bad quality and contains a lot of dangling bonds at the interface between the silicon and the silicon oxide. These defects form generation centers for minority carriers, which results in a high dark leakage current.

A thin (<10 nm) chemical oxide, which can be formed with a self-limited growth is preferred over a native oxide. The chemical oxide has a more controlled growth, which results in less generation centers and lower leakage current. This chemical oxide will contain fixed positive charges. However, the layer of the chemical oxide can intentionally be kept very thin, around 2 to 3 nm, but certainly less than 10 nm. On top of this thin chemical oxide, a layer with a large density of fixed negative charges can be formed. This positive charges will compensate for the negative charges in the oxide and cause a monotonous electric field in the silicon.

Figure 6:
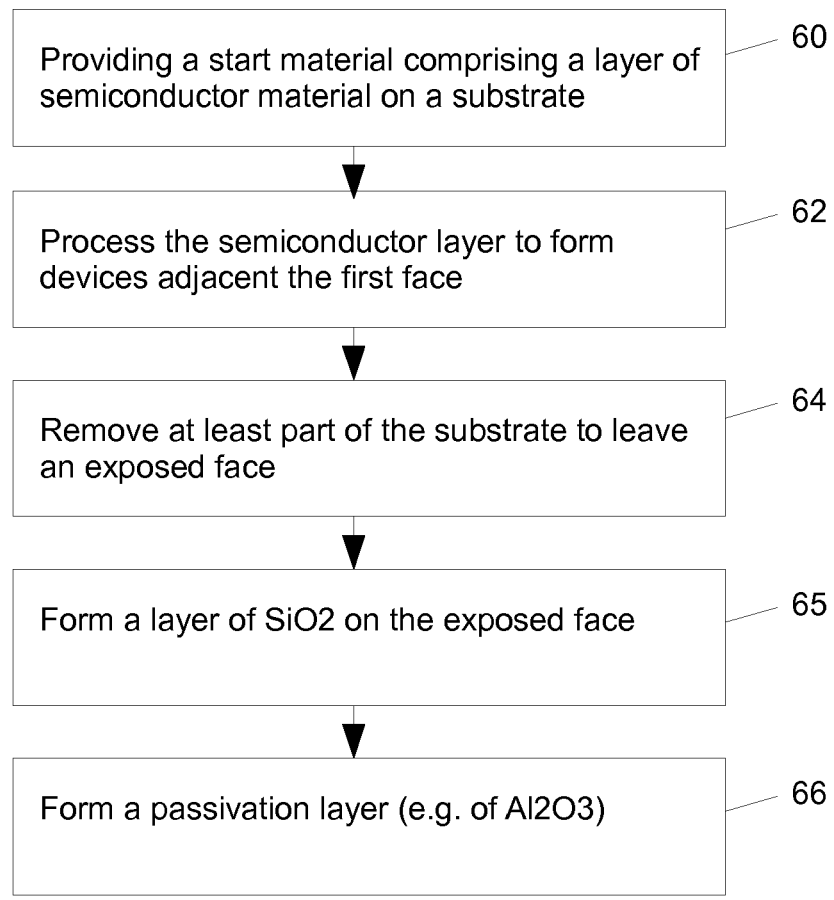
FIG. 6 shows a manufacturing method according to an embodiment of the invention.

FIG. 6 shows the manufacturing method of FIG. 4, with an additional step 65 of forming the SiO2 layer.

Figure 7:
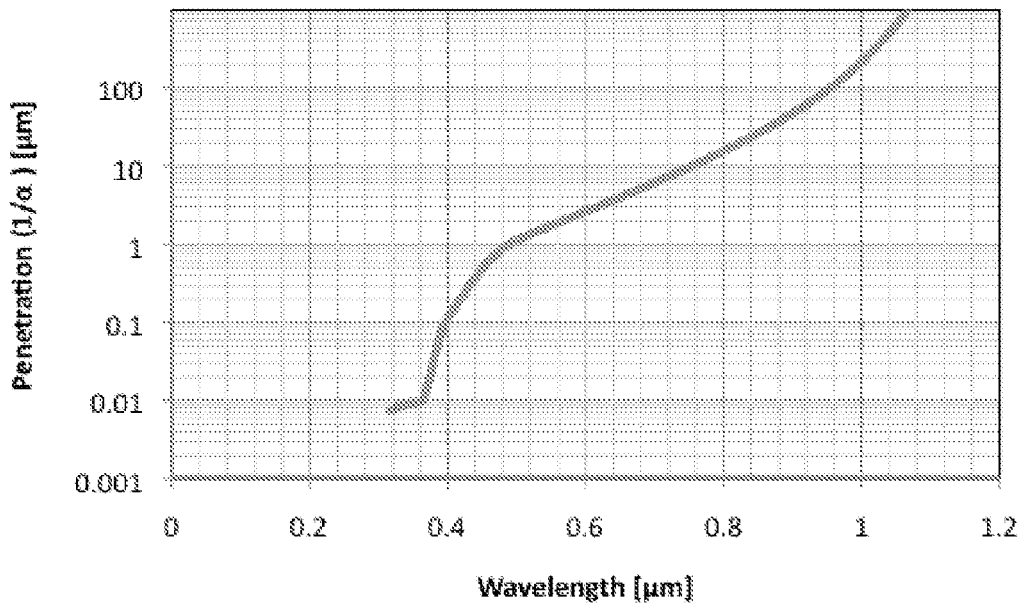
FIG. 7 shows a graph of photon penetration against radiation wavelength.

An advantage of this approach is that the accumulation layer is very shallow. This makes it possible to achieve a good sensitivity for short wavelengths (200 to 400 nm) where the photocharges penetrate only 5 to 10 nm into the silicon. As the accumulation layer is really very shallow (typically only a few atomic layers) at the surface, even shorter wavelength radiation (e.g. UV light) can penetrate the p-substrate behind the accumulation layer and generate photoelectric charges. For short wavelengths, the charges are typically generated very close to the surface. In the 200-400 nm wavelength range, the penetration depth of photons into the silicon is only few 10 nm, as is shown in FIG. 7. Transmission of light in the 150-1000 nm wavelength band is satisfactory for the Al2O3 layer. This is an advantage compared to other passivation techniques. Only the MBE grown boron layers can achieve similar UV sensitivities, however at a much more time-consuming and costly manufacturing step.

Al2O3 can be effectively deposited at low temperatures, which is compatible with post-CMOS wafer processing.

Figure 8:
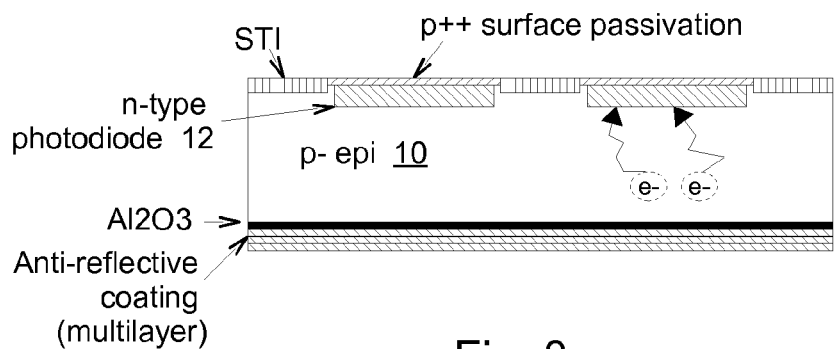
FIG. 8 shows a cross-section of a backside illuminated image sensor with a passivation layer and an anti-reflective coating.
Figure 9:
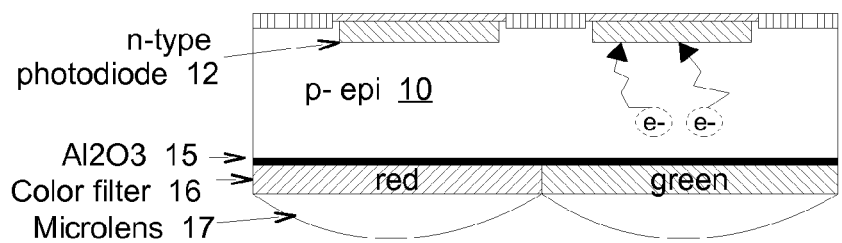
FIG. 9 shows a cross-section of a backside illuminated image sensor with a passivation layer and color filters and microlenses.

FIG. 3 shows an Al2O3 layer 15 on the outermost surface of the image sensor. It is also possible to deposit other layers on top of the Al2O3 (i.e. on the outermost surface of the image sensor) for various purposes, such as:
1) anti-reflective (AR) coating (as shown in FIG. 8). Materials with an optimized refractive index and thickness ensure that the light can be coupled more effectively into the silicon. This depends on the refractive index and thicknesses of the material, and of the Al2O3 layer itself. A stack of Al2O3 and other materials of the right thickness and refractive index could be proposed as an anti-reflective coating. Other materials could be SiN, SiO2, SiON, polymer materials, or even more exotic materials. E.g. stacks of ZnS/MgF2 have also been used as AR coating.
2) for better passivation. E.g. the SiO2 21 on top of Al2O3 can result in better passivation.
3) as a color filter pattern 16 (FIG. 9). These are typically polymer materials, typically red/green/blue but also yellow/cyan/magenta and other combinations are used.
4) as a microlens 17, to focus the light in the center of the pixel (as shown in FIG. 9). This is important mainly for very small pixels, to ensure that the photons end up in the right pixel. It improves sharpness and MTF of the image sensor Although FIG. 3 shows only a p-substrate and n-type photodiodes, other regions/layers can be present in the p-substrate, such as a region or layer which serves to channel charges towards a wanted photodiode junction, as described in EP2075843.

Although FIG. 3 shows a continuous layer of Al2O3 it is possible, after the deposition of the Al2O3 layer, to etch pad openings through this layer, resulting in a 'patterned' Al2O3 layer.

Although other thicknesses could be used, the thickness of the Al2O3 layer is typically between 1 and 150 nm.

Some simulation results will now be discussed. An image sensor can be processed on SOI substrates with a high peak doping at the backside which monotonously reduces to the frontside. Such implant creates a monotonous electric field from the backside to the frontside, which ensures that photoelectric minority carriers diffuse to the frontside, where they are collected by the photodiodes. However, during high-temperature steps in the CMOS process, the peak high doping at the backside outdiffuses inwards into the silicon detector layer. The peak concentration is lowered after CMOS processing, and the peak of the concentration is not located any more near the backside surface but somewhat inwards. This creates a dip in the electric field near the peak of the concentration. Photoelectrically generated minority carriers generated below the peak of the doping concentration will not diffuse to the photodiode. This results in a loss of quantum efficiency at short wavelengths.

Figure 10:
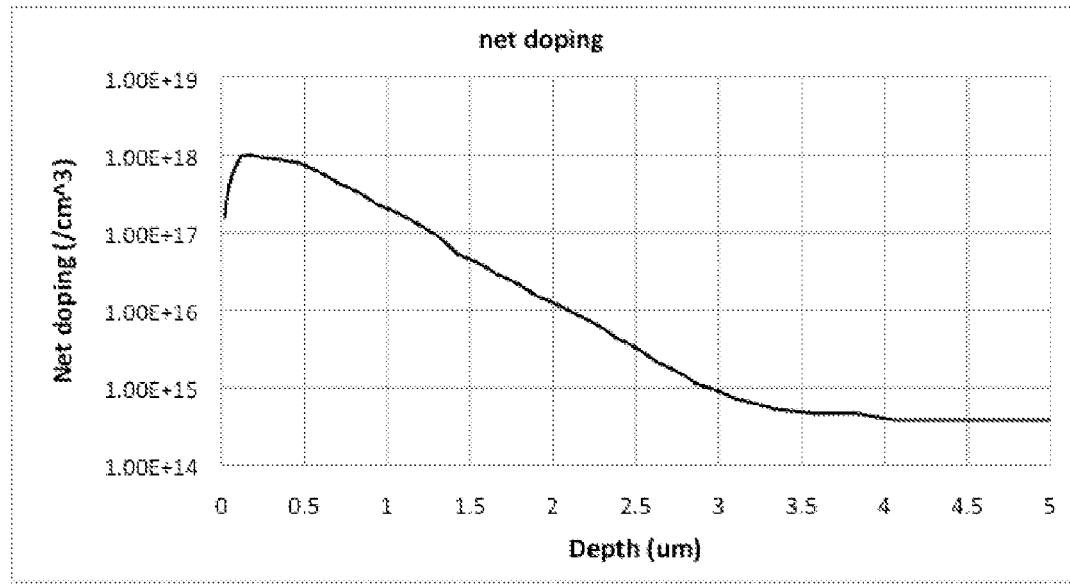
FIG. 10 shows doping concentration profile in a CMOS device wafer after backside thinning showing a peak doping concentration 200 nm below the backside surface.
Figure 11:
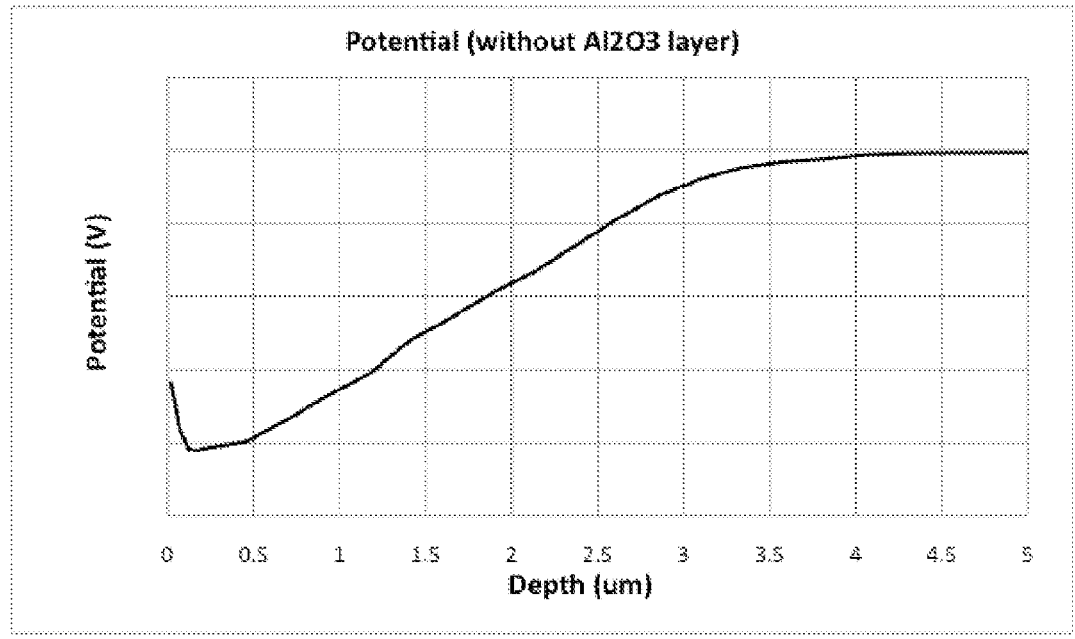
FIG. 11 shows electrostatic potential profile in the detector layer with a doping concentration as in FIG. 10, showing a potential valley near the peak doping concentration.

Measurements have shown that the peak concentration shifted up to 200 nm inwards for certain doping profiles. FIG. 10 shows the measured concentration profile of a wafer after CMOS processing, in which the peak doping concentration of 1E18/cm3 can be seen at a depth of 200 nm. FIG. 11 shows the electrostatic potential profile over the wafer with this profile. A potential valley is present near 200 nm. Electrons generated below 200 nm will move to the backside surface and not to the photodiode.

Figure 12:
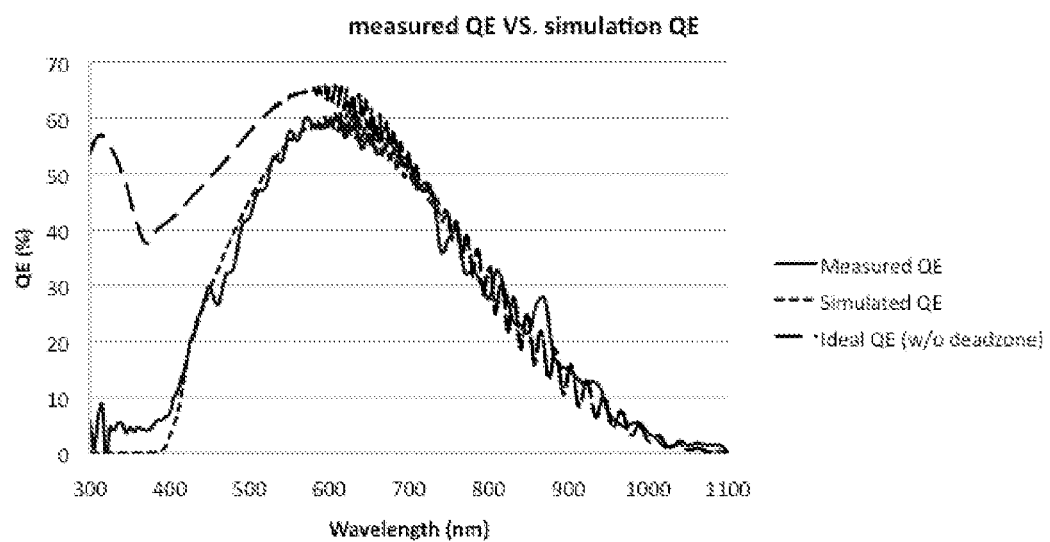
FIG. 12 shows measured quantum efficiency on a backside device with a doping profile as in FIG. 10, without backside passivation. Modelled quantum efficiency with and without a dead zone of 200 nm.

The effect of this outdiffusion was seen as a loss in sensitivity of the sensor for wavelengths below 500 nm. This is clearly visible in FIG. 12, which shows the measured quantum efficiency of the detector with backside illumination. The dashed lines show the modelled quantum efficiency for a detector which is sensitive up to the surface of the silicon (without dead zone) and of a detector which has a dead zone of 200 nm due to a peak in doping concentration. One can observe that the model of the detector with the dead zone of 200 nm fits very well with the measured result. By proper passivation of the backside, the quantum efficiency can be extended between 300 and 500 nm (and also between 200 and 300 nm). The backside surface of the sensor is passivated by the creation of a hole inversion layer, due to the presence of fixed negative charges in the layer on top of the silicon detector layer.

Figure 13:
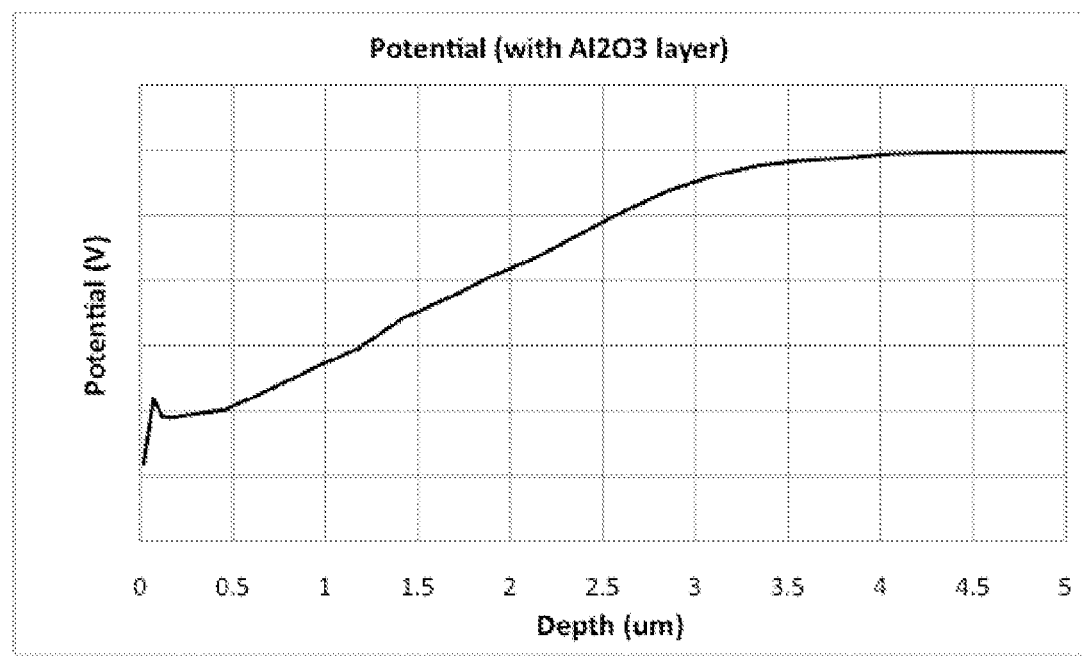
FIG. 13 shows electrostatic potential in the detector layer with a doping concentration as in FIG. 10, covered by a thin layer of Al2O3.

Another device simulation result is shown in FIG. 13 in which the detector layer is covered by a thin Al2O3 layer. A fixed negative charge around 9.6E-12/cm2 is assumed for a thin Al2O3 layer. FIG. 13 shows the electrostatic potential across the detector layer over its depth, with the presence of the Al2O3 layer and the doping profile of FIG. 10. It can be seen that the electrostatic potential is much more monotonous from the backside to the frontside, which will considerably improve the sensitivity in the UV and short wavelength visible range. A small potential barrier can be observed, which could be cancelled out by a higher doping concentration of the initial start wafer, by a lower thermal step in the CMOS processing, or by increased negative fixed charge in the layer on top of the silicon. Furthermore the width of this potential barrier and the height of the barrier is much smaller than the potential peak which is shown at the backside surface in FIG. 11.

Figure 15:
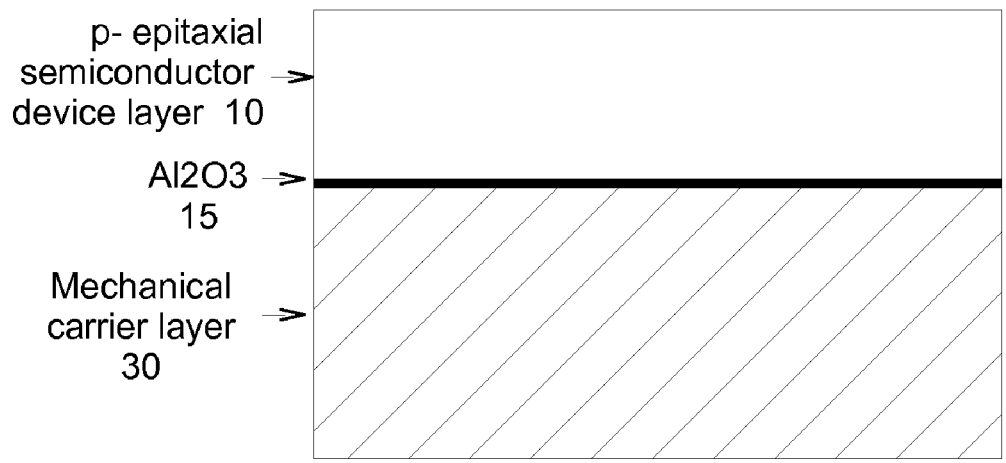
FIG. 15 shows materials used in another manufacturing process.
Figure 16:
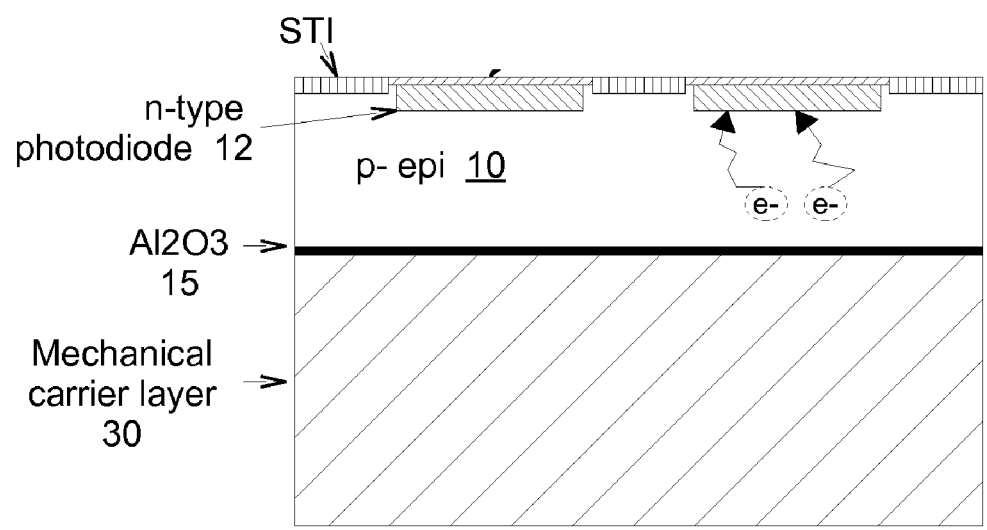
FIG. 16 shows materials used in another manufacturing process.

In an alternative manufacturing process, a start material comprises a mechanical carrier wafer, a layer of Al2O3 and a layer of semiconductor material (e.g. silicon). Such wafer is shown in FIG. 15. There is no particular order for the manufacture of the start material, although one possible order is to begin with the mechanical carrier wafer 30, deposit the Al2O3 layer 15 and then grow the semiconductor (epitaxial) layer 10. The start material can comprise a thin (e.g. 3-10 um) silicon layer and a thin sapphire layer (e.g. a few 10 nm to a few 100 nm). The mechanical carrier wafer 30 can be silicon or any other suitable material. The epitaxial layer 10 of the start material is processed to form the CMOS semiconductor devices (photodiodes, switches) of the image sensor. This results in the structure shown in FIG. 16. Then, a handle wafer is attached at the front and the mechanical carrier wafer under the sapphire is removed.

Figure 14:
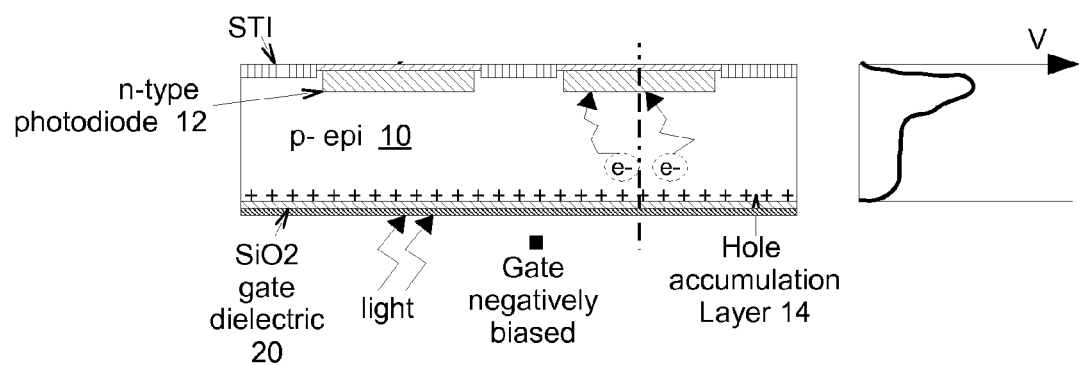
FIG. 14 shows a cross-section of a backside illuminated image sensor (after thinning) employing passivation through a biased gate, and the potential profile across the sensor.

It is also possible to create an inversion layer under a gate deposited at the backside, as shown in FIG. 14. Practical use of this has been limited due to the quantum efficiency reduction caused by light absorption in the gate material, although a transparent gate could be used theoretically (e.g. manufactured with Indium Tin Oxide or ITO which is a transparent metal). Also MBE growth has been practically used only for very low volume and high-end devices given the slow and costly growth of the atomic Boron layers.

The invention is not limited to the embodiments described herein, which may be modified or varied without departing from the scope of the invention.

REFERENCES

[1] S. Shortes, et al, "Development of a Thinned, Backside-Illuminated Charge-Coupled Device Imager", proc. IEDM dig., vol. 19, 1973, page 415
[2] J. Prima, et. al, "A 3 Mega-Pixel Back-illuminated Image Sensor in 1T5 Architecture with 1.45 μm Pixel Pitch", proc. International Image Sensor Workshop, Jun. 6-10, 2007, Ogunquit, Me. (available on www.imagesensors.org)
[3] Y. Kohyama, et al, "A 1.4 um Pixel Backside Illuminated CMOS Image Sensor with 300 mm Wafer based on 65 nm Logic Technology", proc. International Image Sensor Workshop, Bergen, June 2009 (available on www.imagesensors.org
[4] U.S. Pat. No. 7,238,583, "Back-illuminated imaging device and method of fabricating same"
[5] S. G. Wu, et al, "A Manufacturable Back-Side Illumination Technology using Bulk-Si Substrate for Advanced CMOS Image Sensor", proc. International Image Sensor Workshop, Bergen, June 2009 (available on www.imagesensors.org)
[6] U.S. Pat. No. 5,376,810, "Growth of delta-doped layers on silicon CCD/S for enhanced ultraviolet response", 1993
[7] J. Schmidth, et al, "Surface Passivation of High-efficiency Silicon Solar Cells by Atomic-layer-deposited Al2O3", Progeress in Photovoltaics: Research and Applications, vol. 16, p. 461-466, published by J. Wiley, 2008
[8] A. Fish et al, "Low-power Global/Rolling Shutter Image Sensors in Silicon on Sapphire Technology", ISCAS 2005, 23-26 May 2005, pp. 580-583 Vol. 1
[9] J. Park et al, "Phototransistor Image Sensor in Silicon on Sapphire", ISCAS 2008, 18-21 May 2008, pp. 1416-1419.

The invention claimed is:

1. A method of manufacturing a backside illuminated image sensor comprising:
providing a start material comprising a layer of semiconductor material on a substrate, the layer of semiconductor material having a first face and a second, backside, face;
processing the layer of semiconductor material to form semiconductor devices in the layer adjacent the first face;
removing at least a part of the substrate to leave an exposed face;
forming a passivation layer on the exposed face, the passivation layer comprising negative fixed charges.

2. The method according to claim 1, wherein the passivation layer is a layer of Al2O3.

3. The method according to claim 1, wherein the passivation layer has a thickness less than 5 μm.

4. The method according to claim 1, wherein the passivation layer has a thickness less than 500 nm.

5. The method according to claim 1, wherein the passivation layer has a thickness in the range 1 nm-150 nm.

6. The method according to claim 1, comprising forming at least one other layer on the passivation layer.

7. The method according to claim 6, wherein the at least one other layer comprises at least one of: an anti-reflective layer, a layer that increases passivation of the passivation layer, a layer comprising a color filter pattern, or a layer comprising a microlens.

8. The method according to claim 1, comprising forming a layer of SiO2 on the exposed face before forming the passivation layer.

9. The method according to claim 8, wherein the layer of SiO2 is formed with a self-limited growth.

10. The method according to claim 1, wherein the passivation layer has a thickness less than 1 μm.

11. A backside illuminated image sensor resulting from the manufacturing method of claim 1 comprising:
a layer of semiconductor material having a first face and a second, backside, face for exposure to radiation, the material having semiconductor devices of the image sensor formed in it adjacent the first face; and
a passivation layer on the second face, the passivation layer comprising negative fixed charges.

12. The backside illuminated image sensor according to claim 11, wherein the passivation layer is a layer of Al2O3.

13. The backside illuminated image sensor according to claim 11, wherein the passivation layer has a thickness less than 5 μm.

14. The backside illuminated image sensor according to claim 11, wherein the passivation layer has a thickness less than 1 μm.

15. The backside illuminated image sensor according to claim 11, wherein the passivation layer has a thickness less than 500 nm.

16. The backside illuminated image sensor according to claim 11, wherein the passivation layer has a thickness in the range 1 nm-150 nm.

17. The backside illuminated image sensor according to claim 11, further comprising at least one other layer on the passivation layer.

18. The backside illuminated image sensor according to claim 17, wherein the at least one other layer comprises at least one of: an anti-reflective layer, a layer that increases passivation of the passivation layer, a layer comprising a color filter pattern, or a layer comprising a microlens.

* * * * *